United States Patent [19]

Cohen

[11] 4,246,550
[45] Jan. 20, 1981

[54] WIDEBAND, MILLIMETER WAVE FREQUENCY GUNN OSCILLATOR

[75] Inventor: Leonard D. Cohen, Brooklyn, N.Y.

[73] Assignee: Eaton Corporation, Cleveland, Ohio

[21] Appl. No.: 142,170

[22] Filed: Apr. 21, 1980

[51] Int. Cl.$^3$ ............................................. H03B 9/12
[52] U.S. Cl. ...................... 331/107 DP; 331/107 G; 331/177 V
[58] Field of Search ....... 331/107 DP, 107 G, 177 V, 331/96; 332/30 V

[56] References Cited

U.S. PATENT DOCUMENTS

| | | | |
|---|---|---|---|
| 3,548,339 | 12/1970 | Barber et al. | 331/107 G |
| 3,624,550 | 11/1971 | Vane | 331/107 DP X |
| 3,996,529 | 12/1976 | Curtice | 331/107 G X |
| 4,158,784 | 6/1979 | Curtice | 331/107 G X |

OTHER PUBLICATIONS

Bisseger, "Building an Oscillator? Lump It, And Like It!", Microwaves, Jul. 1978, pp. 45-48, 50, 52, 53.
Kawakami, "Some Theoretical and Practical Considerations in the Design of Wideband Varactor Tuned Gunn Oscillators", Wescon 1972, pp. 1-6.
Kosov et al., "Equivalent Parameters of Gunn Diode in Two-Frequency Mode of Operation", Radio Eng. and Electron. Phys., pp. 155-158, vol. 23, Oct. 78.
Kooi et al., "Harmonic Generation Using Gunn Diodes", Electronic Letters, vol. 5, Apr. 17, 1969, pp. 159-160.

*Primary Examiner*—Siegfried H. Grimm
*Attorney, Agent, or Firm*—Kevin Redmond

[57] ABSTRACT

A tunable millimeter wave frequency Gunn oscillator operates efficiently beyond the normal Gunn oscillator frequency range through the use of a second harmonic enhancement circuit. The enhancement circuit is tuned to the fundamental frequency of the oscillator and is tracked with a second harmonic circuit to provide a wide tuning range. Lumped element circuitry is used to aid in providing the wide tuning range and to facilitate adjustment and fabrication.

5 Claims, 5 Drawing Figures

WIDEBAND, MILLIMETER WAVE FREQUENCY GUNN OSCILLATOR

BACKGROUND

1. Field

This invention relates to improvements in millimeter wave frequency circuitry and in particular, to solid state millimeter wave oscillators.

2. Prior Art

GaAs Gunn diode oscillators currently operate over the frequency range of 3 to 100 GHz. The theoretical high frequency limit of the Gunn diode oscillator range is just above 100 GHz and is set by the intervalley relaxation time of the Gunn diode. Second harmonic output from such oscillators has been obtained, but it is usually 20 dB below the fundamental power. Typically, circuits in these frequency ranges employ distributed parameter elements, such as multiwavelength transmission lines which limit the tuning range of an oscillator because of the rapid phase change of these lines with changes in operating frequency.

SUMMARY

It is an object of the present invention to provide a Gunn diode oscillator with a wide tuning range.

It is another object to provide an oscillator capable of efficiently producing a signal in a frequency range beyond the normal operating range of a Gunn diode oscillator.

It is another object to provide a millimeter wave Gunn diode oscillator with miniature, low cost and easily adjusted circuitry.

The oscillator circuitry in the present invention comprises principally two series circuits placed across the Gunn diode. The first of these circuits presents a resonant high impedance to the diode at both the fundamental and the second harmonic frequencies, while the second presents a parallel resonance to the diode at the fundamental frequency and is used to enhance the output of the second harmonic signal.

Both of these circuits employ lumped element components, including chip capacitors and varactors, as well as fractional wavelength air dielectric transmission lines.

DETAILED DESCRIPTION OF THE INVENTION

The operating frequency of a GaAs Gunn diode is limited to approximately 100 GHz by the intervalley relaxation time. If a higher frequency is desired, such as 120 GHz, the second harmonic of a Gunn oscillator may be used to provide this signal. However, the second harmonic output power is usually well below that of the fundamental and if the second harmonic signal is to be usable, it must have sufficient power for an intended application. Therefore, the efficient generation of power at the second harmonic is important. An improvement of 10 dB in the second harmonic power output over that obtained from conventional circuitry is provided by the circuitry of the present invention.

Figure 1:
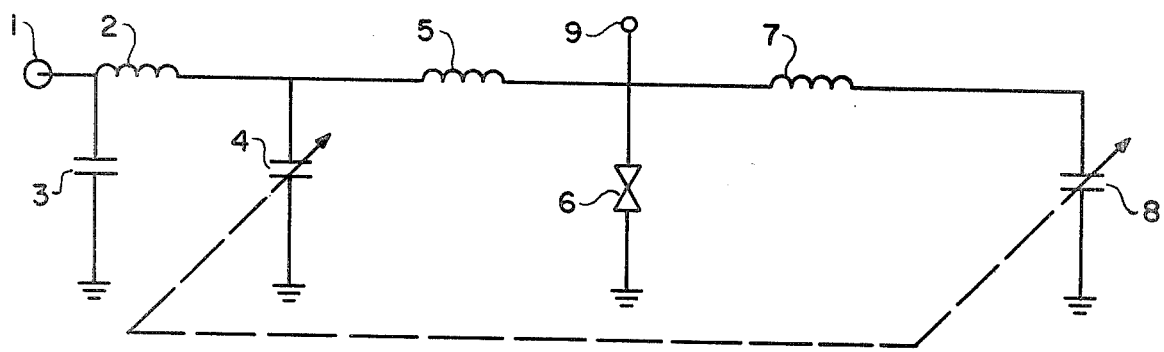
FIG. 1 is a schematic diagram illustrating the principles of the circuitry used in the present invention.

The elements of the present invention shown in FIG. 1 are a bias filter choke 2, a bias filter capacitor 3, a first variable capacitor 4, a first circuit choke 5, a Gunn diode 6, a second circuit choke 7, and a second variable capacitor 8. Drawing numerals 1 and 9 refer to a bias input terminal and a signal output port, respectively.

For purposes of analysis, this circuit may be divided into three portions: the bias circuitry, the second harmonic frequency circuitry and the fundamental frequency circuitry. The bias circuitry consists of the filter capacitor 3, bias choke 2 and to a limited extent, choke 5. Capacitor 3 and choke 2 form a simple low-pass filter designed to isolate the bias supply from the millimeter wave circuitry of the oscillator. Bias voltage is applied to a bias terminal 1 and then is supplied to the Gunn diode through chokes 2 and 5. Choke 5 serves to isolate the diode at the fundamental oscillator frequency from the bias circuitry. The complete function of choke 5 is explained in greater detail in connection with the second harmonic circuitry.

As is common in the operation of Gunn diodes, the diode bias is set to a voltage which causes the diode to exhibit a negative resistance. Placing this negative resistance across a parallel resonant circuit satisfies the conditions necessary for oscillation. The fundamental frequency circuitry provides the required parallel resonant circuit for oscillation.

The fundamental frequency circuitry comprises the choke 7 and the capacitor 8. This circuit, in combination with the reactance of the diode and any residual reactance present at the fundamental frequency from other circuitry connected to the diode, constitute a resonant circuit at the fundamental frequency. This circuit may be tuned by variable capacitor 8.

Figure 3:
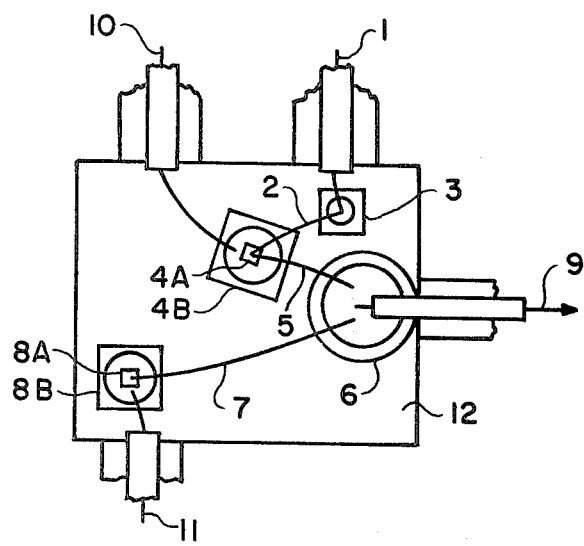
FIG. 3 is a pictorial view of typical lumped element circuitry used to fabricate the present invention.
Figure 4A:
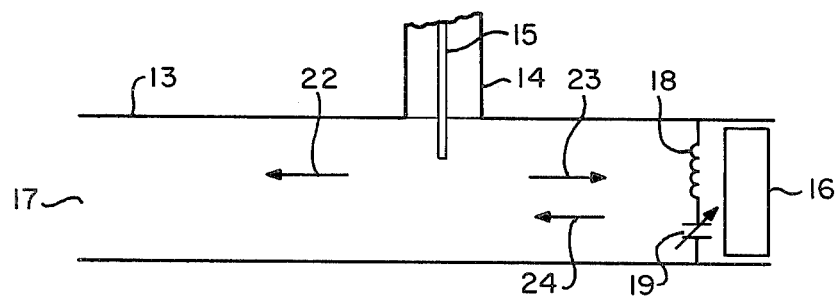
FIGS. 4A and 4B are cross sectional views of a waveguide transition.

As shown in FIG. 3, signal output port 9 is a coaxial transmission line. A transition to waveguide, shown in FIG. 4A, is used at port 9 to provide an interface to conventional millimeter waveguide, which provides significantly lower transmission loss to the load over that provided by a purely coaxial line. In FIG. 4A, an extension 14 of the coaxial line at port 9 is shown with its center conductor 15 extending into a waveguide 13. A short, 16, is located at one end of the waveguide, while the opposite end of the waveguide 17 serves as the output port.

The transition is such that energy can propagate equally in two directions in the waveguide portions, as indicated by the arrows 22 and 23. The short circuit is positioned to reflect energy 24 at the fundamental frequency in the proper phase to suppress the fundamental from the output, while energy at the second harmonic is reinforced at the output. These effects at the fundamental and second harmonic are complementary. A high-pass filter may be used at the waveguide output port to provide increased suppression of the fundamental from the load, if required.

It has been found experimentally that the position of the short does not have to be adjusted to provide satisfactory performance over a relatively wide band of frequencies; however, complete optimization can be achieved by fine tuning the position of the short.

It is possible to electronically adjust the position of the short and to "gang" the control voltage for this electronic adjustment to the control voltages used for other varactors to be described later, making the short adjustment automatic.

Figure 4B:
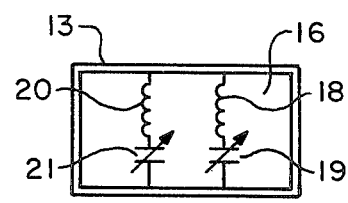

An embodiment shown in FIG. 4B which may be used to achieve this end consists of two series circuits, the first tuned near resonance at the fundamental frequency while the second is tuned near resonance at the second harmonic frequency. The first resonant circuit consists of choke 18 and varactor 19 while the second consists of choke 20 and varactor 21. These circuits are placed a small fraction of a wavelength in front of the short, as shown by the position of choke 18 and varactor 19 in FIG. 4A. Biasing circuits for the varactors are conventional and are not shown to simplify the drawings. Adjustment of control voltages applied to the varactors in these circuits will tune them close to resonance at their respective operating frequencies, thereby affecting the phase of the reflected signals emanating from the region of the short to effectively electronically adjust the position of the short.

By means of the adjustment of the short, the fundamental frequency power is reflected back to the diode in a phase relationship which increases the second harmonic output power and thus the oscillator efficiency at frequencies beyond the fundamental operating range of the Gunn diode. For the sake of brevity, this effect is referred to herein as second harmonic enhancement.

The second harmonic circuitry comprises the capacitor 4 and the choke 5. The purpose of this circuit is to present a reactance to the Gunn diode which in combination with the reactance of the diode and associated circuitry forms a parallel resonant circuit at the second harmonic frequency. This circuit may be tuned by the variable capacitor 4.

The capacitors 4 and 8 are ganged so that both the fundamental and second harmonic circuits may be simultaneously tuned over a relatively wide tuning range.

Figure 2:
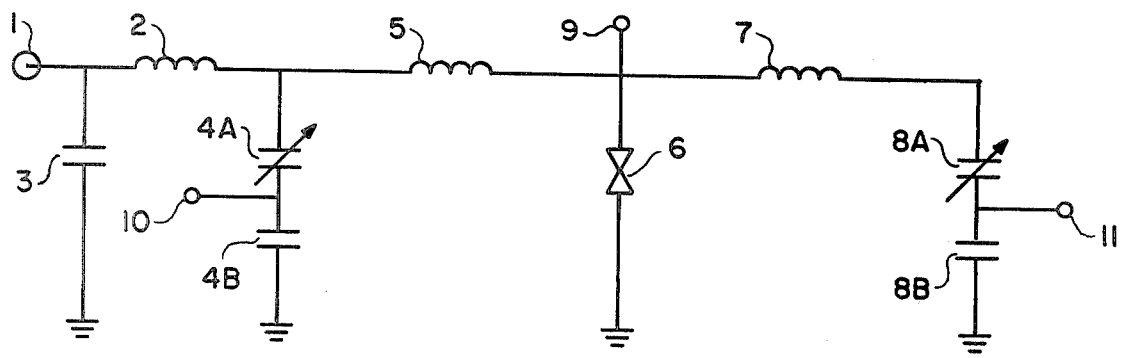
FIG. 2 is a schematic diagram illustrating a practical embodiment of the present invention.

In the more practical embodiment of the invention shown in FIG. 2, the tuning is performed electronically by means of varactors. The capacitors 4 and 8 in FIG. 1 are replaced by capacitors 4A, 4B, 8A and 8B in FIG. 2. Capacitors 4A and 8A are varactors while capacitors 4B and 8B are fixed value capacitors which function as a dc block and rf bypass. The required variation in capacity is supplied entirely by the varactors. The varactors also may be "ganged" merely by supplying the bias for both from a common source. This approach can be used to electronically control the short as well. Usually, a small offset in the bias control voltage is all that is required to account for the different frequency at which varactor 4A and 8A must operate.

The bias voltage to the varactors is supplied through terminal 10 for varactor 4A and through terminal 11 for varactor 8A. Although not shown, a bias choke is normally added to the varactor bias terminals. This choke provides for increased bias filtering from that provided by capacitors 4B and 8B alone.

Choke 5 is a one-quarter wave transmission line at the fundamental frequency and a one-half wavelength transmission line at the second harmonic frequency. The capacitors 4A and 4B represent a relatively low impedance at the fundamental frequency which is reflected through the one-quarter wavelength line of choke 5 to the Gunn diode as a high impedance, preventing the loss of power at the fundamental frequency through the second harmonic circuit.

As a one-half wave transmission line at the second harmonic frequency, choke 5 reflects the reactance of the combination of capacitor 4A and 4B across the Gunn diode to tune the diode and its associated reactance to parallel resonance at the second harmonic frequency. Choke 5 performs the functions of isolating the diode from the bias network at terminal 1 at the fundamental frequency, isolating the diode from capacitors 4A and 4B at the fundamental frequency, supplying the bias voltage to the diode, and presenting the reactance of capacitors 4A and 4B to the diode at the second harmonic frequency. All these functions as well as the advantages of ease of tuning and wide bandwidth are produced simply and at low cost by a single lumped element component. The simplicity of this component can be seen in FIG. 3.

FIG. 3 is a pictorial representation of a circuit embodying the present invention. All the components employ the same drawing numerals as were used in FIGS. 1 and 2. The only added drawing numeral is 12 which represents a ground plane and mounting surface. The actual size of this surface is only one-eighth inch by one-eighth inch in $K_a$ band (26 to 40 GHz) and is sized to be cut off to waveguide modes. Although this circuit is designed to operate at millimeter wave frequencies, it uses lumped element components throughout. Capacitors 4B and 8B are MOS type chip capacitors, while varactors 4A and 8A are chip varactors. Chokes 5 and 7 are air dielectric transmission lines formed of single conductors spaced above the ground plane. These lines are considered as lumped element devices because their lengths are only a small fraction of a wavelength. As such, these lines do not present the problem encountered with distributed parameter circuitry where rapidly varying phase as a function of frequency produced by multiwavelength lines prevent tuning the oscillator over wide frequency ranges.

It is evident from the simplicity of the circuitry shown in FIG. 3 that small and easily fabricated circuits may be constructed using lumped circuit elements at frequencies in the millimeter wave frequency range. This type of construction also facilitates adjustment of the circuit. The effective length and impedance of the air dielectric transmission lines shown in FIG. 3 may be adjusted by arching the lines above the ground plane. This avoids the usual redesign and refabrication necessary with printed transmission lines to make the same adjustments.

It should be noted that the construction of the lines shown in FIG. 3 is merely representative. Other types of transmission lines are contemplated as being within the spirit and scope of this invention. For example, there need be no ground plane or the ground plane need not be as well defined as it is in FIG. 3. The representation of a transmission line by a single line and ground plane will be used herein to represent transmission lines with single or multiple conductors and with or without a defined ground plane.

Having described the invention, I claim:

1. A Gunn diode oscillator designed to efficiently produce a signal tunable over a millimeter wavelength frequency range, beyond the normal operating frequency range of the Gunn diode, comprising:
   (a) a Gunn diode having first and second terminals, said diode being biased to exhibit a negative resistance,
   (b) a first series circuit comprising:
      (i) a first lumped element choke having first and second terminals, an electrical length of nominally one-fourth wavelength at the fundamental frequency of the oscillator and nominally one-half wavelength at the second harmonic of the oscillator, said choke being connected at its first terminal to the first terminal of the Gunn diode, and (ii) a first lumped element variable capacitor having first and second terminals, connected at its first terminal to the second terminal of the first choke and at its second terminal to the second terminal of the Gunn diode, said capacitor being adjusted to present to the diode, by way of the first choke, a reactance which in combination with the reactances of and associated with the diode forms a substantial impedance at the diode at both the fundamental and second harmonic frequencies of the oscillator, (c) a second series circuit, comprising:

(i) a second lumped element choke having first and second terminals, said second choke being connected at its first terminal to the first terminal of the diode, (ii) a second lumped element variable capacitor having a first and second terminal, said second capacitor being connected at its first terminal to the second terminal of the second choke, and at second terminal to the second terminal of the diode, said second capacitor and second choke presenting to the diodes a parallel resonant impedance at the fundamental frequency of the oscillator, (d) a waveguide capable of propagating the fundamental and second harmonic frequencies of the oscillator, (e) means for coupling the output of the Gunn diode to a point along the waveguide to propagate the oscillator signal in two opposite directions within the waveguide, said directions lying generally along the longitudinal axis of the waveguide, (f) a short within the waveguide at a distance from the point at which the oscillator is coupled to cancel the fundamental and enhance the second harmonic flow in a direction away from the short, and (g) means for ganging said first and second capacitors to tune said oscillator over a frequency range for an enhanced second harmonic signal at a frequency beyond the fundamental operating range of the oscillator.

2. A Gunn diode oscillator as claimed in claim 1, further comprising a ground plane to which is connected the second terminal of the diode and wherein:

(a) said first and second chokes are formed of air dielectric transmission lines spaced above the ground plane, said lines being adjusted by varying the spacing of these lines above the ground plane, (b) said first and second capacitors each comprised of a fixed lumped element capacitor in series with a varactor diode, said varactors serving as the means for varying the capacitance, (c) said means for ganging includes a common variable voltage source to bias said varactors.

3. An oscillator as claimed in claim 2, further comprising:

(a) a first series tuned circuit resonant at the fundamental frequency consisting of a choke and a variable capacitor placed across the waveguide in close proximity to the short to receive power at the fundamental frequency and control the phase of the reflected fundamental signal by means of varying the capacitor in this series circuit, and (b) a second series tuned circuit resonant at the second harmonic frequency of the oscillator consisting of a choke and a variable capacitor positioned in close proximity to the short to receive power at the second harmonic frequency and control the phase of the second harmonic frequency signal reflected from the short, for optimizing the second harmonic output power of the oscillator.

4. An oscillator as claimed in claim 3, wherein the variable capacitors in the series resonant circuits across the waveguide tuned to the fundamental and second harmonic frequencies are varactors and the bias control voltage for said varactors is derived from said common voltage source to adjust the capacitance of all varactors simultaneously for optimum second harmonic power output from said oscillator.

5. A method for efficiently producing a tunable signal from a Gunn diode oscillator in a frequency range beyond the normal operating range of the Gunn diode, comprising the steps of:

(a) providing a ground plane, (b) providing a Gunn diode biased to exhibit a negative resistance, and connecting said diode at one end to said ground plane, (c) providing a first series circuit connected across said diode, said first series circuit comprising a first air dielectric transmission line nominally one-fourth wavelength in electrical length at the fundamental frequency of the diode oscillator, said first transmission line being spaced above said ground plane and connected at one end to the Gunn diode terminal away from the ground plane, a first varactor and a first lumped element capacitor, the free terminal of the first lumped element capacitor being connected to the Gunn diode terminal connected to the ground plane, (d) providing a second series circuit connected across the diode comprising a second air dielectric transmission line spaced above the ground plane, and connected to the diode terminal away from the ground plane, a second varactor, a second lumped element capacitor, the free terminal of the second lumped capacitor being connected to the diode terminal connected to the ground plane, (e) providing a waveguide capable of propagating the fundamental and second harmonic signals of the oscillator, (f) providing means for coupling the output of the Gunn diode at its terminal away from the ground plane to a point along the waveguide to propagate the oscillator signal in two directions generally along the longitudinal axis of the waveguide, (g) a short within the waveguide at a distance from the point at which the oscillator is coupled to cancel the fundamental and enhance the second harmonic flow in the direction away from the short, (h) providing means for electrically ganging the control voltage of the varactors to present from the first series circuit to the diode, a reactance which in combination with the associated diode reactances produces a substantial impedance at the diode at the first and second harmonic frequency of the oscillator, and to present to the diode from the second series circuit a parallel resonance impedance at the fundamental frequency, and (i) adjusting the distance of the air transmission lines above the ground plane to assist in centering the first and second varactor tuning ranges to coincide with that of the second harmonic and fundamental frequencies of the oscillator, respectively to produce an enhanced second harmonic output from the waveguide.

* * * * *